(12) United States Patent
Pannell et al.

(10) Patent No.: US 7,012,436 B1
(45) Date of Patent: Mar. 14, 2006

(54) CABLE TESTER

(75) Inventors: Donald Pannell, Cupertino, CA (US);
William Lo, Cupertino, CA (US);
Yiqing Guo, Cupertino, CA (US)

(73) Assignee: Marvell International LTD, Hamilton (BM)

( * ) Notice: Subject to any disclaimer, the term of this patent is extended or adjusted under 35 U.S.C. 154(b) by 0 days.

(21) Appl. No.: 11/093,101

(22) Filed: Mar. 29, 2005

Related U.S. Application Data

(60) Division of application No. 10/331,221, filed on Dec. 30, 2002, which is a continuation-in-part of application No. 10/165,467, filed on Jun. 7, 2002, now Pat. No. 6,825,672.

(51) Int. Cl.
*G01R 31/02* (2006.01)

(52) U.S. Cl. .................. 324/539; 324/533; 324/534
(58) Field of Classification Search ........ 324/532–535, 324/537–539, 522, 523, 527
See application file for complete search history.

(56) References Cited

U.S. PATENT DOCUMENTS

| | | | |
|---|---|---|---|
| 4,914,394 A | 4/1990 | Meyer | |
| 5,461,318 A | 10/1995 | Borchert et al. ............. | 324/533 |
| 6,138,080 A | 10/2000 | Richardson | |
| 6,198,727 B1 | 3/2001 | Wakeley et al. ............. | 370/247 |
| 6,377,640 B1 | 4/2002 | Trans .......................... | 375/354 |
| 6,434,716 B1 | 8/2002 | Johnson et al. .............. | 714/712 |
| 6,448,899 B1 | 9/2002 | Thompson ................ | 340/815.4 |
| 6,522,152 B1 | 2/2003 | Tonti et al. .................. | 324/628 |
| 6,694,017 B1 | 2/2004 | Takada ........................ | 379/402 |
| 6,728,216 B1 | 4/2004 | Sterner ........................ | 370/252 |
| 6,775,529 B1 | 8/2004 | Roo | |
| 6,829,223 B1 | 12/2004 | Richardson et al. | |
| 2002/0124110 A1 | 9/2002 | Tanaka | |

FOREIGN PATENT DOCUMENTS

| | | |
|---|---|---|
| WO | WO 01/11861 | 2/2001 |
| WO | WO 01/11861 A2 | 2/2001 |
| WO | WO 01/11861 A3 | 2/2001 |

OTHER PUBLICATIONS

U.S. Appl. No. 09/678,728, filed Oct. 4, 2000.
U.S. Appl. No. 10/098,865, filed Mar. 15, 2002.
U.S. Appl. No. 09/991,043, filed Nov. 21, 2001.
Intel, "LXT9784 Octal 10/100 Transceiver Hardware Integrity Function Overview" Application Note, Jan. 2001, pp. 3-14.
IEEE std. 802.3 IEEE Standard for Information technology—Telecommunications and information exchange between systems—Local and metropolitan area networks—Specific requirements; Part 3: Carrier sense multiple access with collison detection (CSMA/DC) access method and physical layer specifications, 2002, pp. 1-173.

*Primary Examiner*—Anjan Deb
*Assistant Examiner*—Timothy J. Dole

(57) ABSTRACT

A physical layer device is adapted to communicate with a cable medium and communicates with an indicator. The physical layer device includes a first input/output terminal, a first transceiver that communicates with the first input/output terminal that is adapted to be connected to a cable medium, and a cable tester that tests the cable medium and determines a cable status using a pretest module. The pretest module senses activity on the cable medium and enables testing if activity is not detected for a first period, and a test module that is enabled by said pretest module, transmits a test pilse on the cable medium, measures a reflection amplitude and calculates a cable length. The cable tester determines the cable status based on the measured amplitude and the calculated cable length, and the indicator indicates at least one of cable testing status during the test and the cable status after the trst. The indicator also inducates at least one of link presence, link absence, link acitivty, link duplex and link speed of the first input/output terminal during normal operation.

59 Claims, 13 Drawing Sheets

CABLE TESTER

CROSS-REFERENCE TO RELATED APPLICATIONS

This application is a divisional of U.S. patent application Ser. No. 10/331,221, filed Dec. 30, 2002, which is a continuation-in-part of U.S. patent application Ser. No. 10/165,467 filed Jun. 7, 2002, now U.S. Pat. No. 6,825,672. The disclosures of the above applications are incorporated herein by reference in their entirety.

FIELD OF THE INVENTION

The present invention relates to electronic diagnostic systems, and more particularly to testing equipment for cable used in a network.

BACKGROUND OF THE INVENTION

One goal of a network manager is to control total cost of ownership of the network. Cabling problems can cause a significant amount of network downtime and can require troubleshooting resources, which increase the total cost of ownership. Providing tools that help solve cabling problems more quickly will increase network uptime and reduce the total cost ownership.

Referring now to FIG. 1, conventional cable testers 10 are frequently used to isolate cabling problems. The cable testers 10 are coupled by a connector 12 (such as an RJ-45 or other connector) to a cable 14. A connector 15 connects the cable to a load 16. Conventional cable testers typically require the load 16 to be a remote node terminator or a loop back module. Conventional cable tests may generate inaccurate results when the cable is terminated by an active link partner that is generating link pulses during a test. The cable tester 10 performs cable analysis and is able to detect a short, an open, a crossed pair, or a reversed pair. The cable tester 10 can also determine a cable length to a short or open.

A short condition occurs when two or more lines are short-circuited together. An open condition occurs when there is a lack of continuity between ends at both ends of a cable. A crossed pair occurs when a pair communicates with different pins at each end. For example, a first pair communicates with pins 1 and 2 at one end and pins 3 and 6 at the other end. A reversed pair occurs when two ends in a pair are connected to opposite pins at each end of the cable. For example, a line on pin 1 communicates with pin 2 at the other end. A line on pin 2 communicates with pin 1 at the other end.

The cable tester 10 employs time domain reflection (TDR), which is based on transmission line theory, to troubleshoot cable faults. The cable tester 10 transmits a pulse 17 on the cable 14 and measures an elapsed time until a reflection 18 is received. Using the elapsed time and a cable propagation constant, a cable distance can be estimated and a fault can be identified. Two waves propagate through the cable 14. A forward wave propagates from a transmitter in the cable tester 10 towards the load 16 or fault. A return wave propagates from the load 16 or fault to the cable tester 10.

A perfectly terminated line has no attenuation and an impedance that is matched to a source impedance. The load is equal to the line impedance. The return wave is zero for a perfectly terminated line because the load receives all of the forward wave energy. For open circuits, the return wave has an amplitude that is approximately equal to the forward wave. For short circuits, the return wave has a negative amplitude is also approximately equal to the forward wave.

In transmission line theory, a reflection coefficient is defined as:

$$T_L = \frac{R\_wave}{F\_wave} = \frac{V_-}{V_+} = \frac{Z_L - Z_O}{Z_L + Z_O}$$

Where $Z_L$ is the load impedance and $Z_O$ is the cable impedance. The return loss in (dB) is defined as:

$$R_L(db) = 20LOG_{10}\left|\frac{1}{T_L}\right| = 20LOG_{10}\left|\frac{Z_L + Z_O}{Z_L - Z_O}\right|$$

Return loss performance is determined by the transmitter return loss, the cable characteristic impedance and return loss, and the receiver return loss. IEEE section 802.3, which is hereby incorporated by reference, specifies receiver and transmitter minimum return loss for various frequencies. Additional factors that may affect the accuracy of the return loss measurement include connectors and patch panels. Cable impedance can also vary, for example CAT5 UTP cable impedance can vary ±15 Ohms.

Consumers can now purchase lower cost switches, routers, network devices and network appliances that include physical layer devices with ports that are connected to cable. When connecting these network devices to cable, the same types of cabling problems that are described above may occur. In these lower cost applications, the consumer typically does not have a cable tester or want to purchase one. Therefore, it is difficult to identify and diagnose cable problems without simply swapping the questionable cable with a purportedly operating cable. If the purportedly operating cable does not actually work, the consumer may incorrectly conclude that the network device is not operating and/or experience further downtime until the cable problem is identified.

SUMMARY OF THE INVENTION

A physical layer device according to the present invention is adapted to communicate with a cable medium and includes at least one indicator that identifies at least one of link presence, link absence, link activity, link duplex and link speed of the first input/output terminal during normal operation. A first tranceiver communicates with a first input/output terminal and the cable medium and includes a cable tester that tests the cable medium and determines a cable status. The cable tester also uses the indicator to indicate at least one of cable testing status during the test and the cable status after the test.

In other features, the cable tester includes a pretest module that senses activity on the cable medium and enables testing if activity is not detected for a first period. A test module is enabled by the pretest module, transmits a test pulse on the cable medium, measures a reflection amplitude and calculates a cable length. The cable tester determines the status based on the measured amplitude and the calculated cable length.

The pretest module enables testing if, during the first period, activity is detected and is subsequently not detected for a second period after the activity is detected. A lookup table includes a plurality of sets of reflection amplitudes as a function of cable length. The cable tester determines the cable status using the lookup table, the reflection amplitude and the cable length. The cable status includes good, open and short cable statuses.

In still other features, the sets of reflection amplitudes define a plurality of windows including a first window that is defined by first and second thresholds. The first threshold is based on a first set of reflection amplitudes that are measured as a function of cable length when a test cable type is an open circuit. The second threshold is based on a second set of reflection amplitudes that are measured as a function of cable length when the test cable type is terminated using a first impedance having a first impedance value.

In still other features, a second window is defined by third and fourth thresholds. The third threshold is based on a third set of reflection amplitudes that are measured as a function of cable length when the test cable type is a short circuit. The fourth threshold is based on a fourth set of reflection amplitudes that are measured as a function of cable length when the test cable type is terminated using a second impedance having a second impedance value. A third window is defined between the second and fourth thresholds.

In yet other features, the cable medium is declared an open circuit when the reflection amplitude is in the first window for the cable length. The cable medium is declared a short circuit when the reflection amplitude is in the second window for the cable length. The cable medium is declared normal when the reflection amplitude is in the third window for the cable length.

In yet other features, an analog to digital converter (ADC) measures the reflection amplitude. The test module measures offset at the ADC, subtracts the offset from the reflection amplitude, and zeroes the reflection amplitude below a floor. The floor has a first value during a first period after the test pulse and a second value during a second period after the first period.

In still other features, the physical layer device includes a plurality of input/output terminals and the cable tester includes a test actuator that triggers the test during operation of the physical layer device for unlinked input/output terminals but not unlinked input/output terminals. The cable tester enters a test fail status when the cable medium is active for a period greater than a test fail period. The cable tester is integrated with the tranceiver in a single integrated circuit. The indicator includes at least one of an audio indicator and a visual indicator. The indicator includes at least one of a speaker, a light emitting diode (LED), and an incandescent light.

In still other features, the physical layer device includes a detector that detects a power over Ethernet (POE) device and a power supply. A switching device selectively provides power from the power supply over the cable medium when the detector detects the POE device. The cable tester delays testing of the cable medium when the detector detects the POE device until the switching device provides the power.

In still other features, the physical layer device implement one of a switch, a router, a computer, a laptop, a smart videocassette recorder, an IP telephone, a fax machine, a modem, a television, a stereo, and a hand-held device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 11 is a functional block diagram of an exemplary network device that includes one or more physical layer devices and that initiates cable testing at power on;

DETAILED DESCRIPTION OF THE PREFERRED EMBODIMENTS

Figure 1:
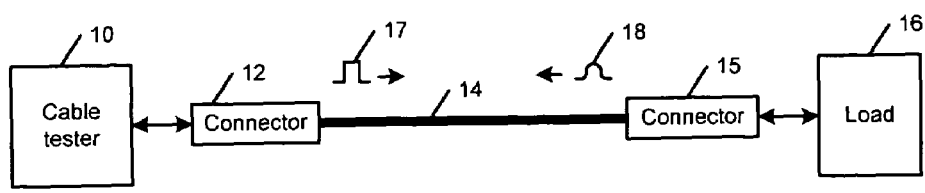
FIG. 1 is a functional block diagram of a cable tester according to the prior art.

The following description of the preferred embodiment(s) is merely exemplary in nature and is in no way intended to limit the invention, its application, or uses. For purposes of clarity, the same reference numbers will be used in the drawings to identify the same elements.

Figure 2:
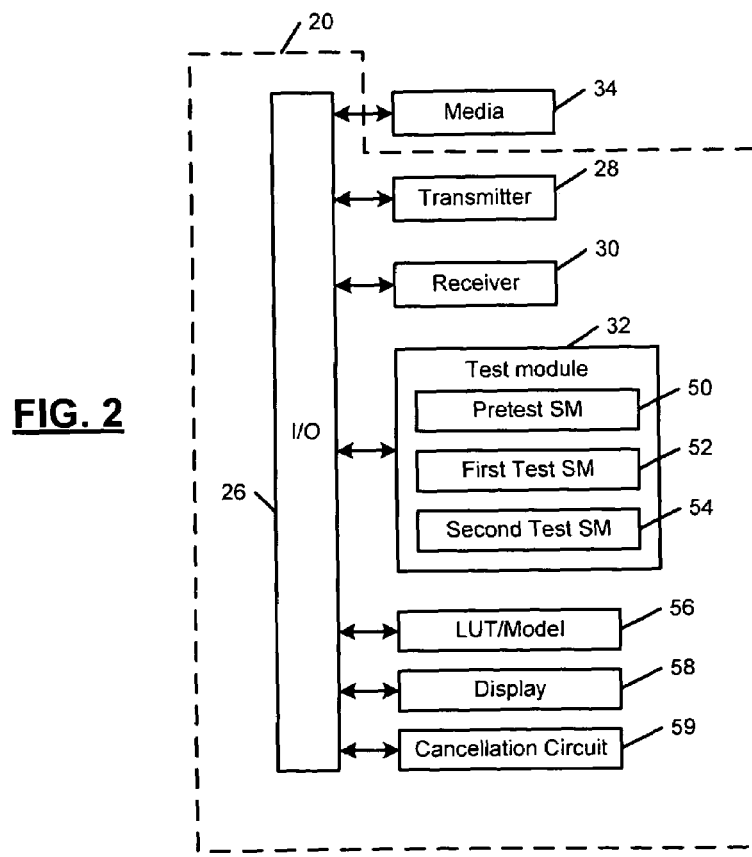
FIG. 2 is a functional block diagram of a cable tester according to the present invention.

Referring now to FIG. 2, a cable tester 20 according to the present invention is shown. The cable tester 20 is capable of testing 10/100BaseT cable, 1000BaseT cable, and/or other cable media. For example, 10/100BaseT includes two pairs of twisted pair wires and 1000BaseT cable includes four pairs of twisted pair wires. A transmitter 28 and a receiver 30 are coupled to the I/O interface 26. A test module 32 includes state machines for testing a media 34 such as cable. The test module 32 can be implemented in combinatorial logic, using discrete circuits, and/or using a processor and memory that executes testing software.

The test module 32 includes a pretest state machine or module 50. The test module 32 also includes a first test state machine or module 52 and/or a second test state machine 54. One or more lookup tables 56 containing cable empirical data are also provided as will be described below. The cable tester 20 may also include a display 58 for presenting fault status, cable length and/or reflection amplitude data. A cancellation circuit 59 cancels the test pulse when testing on media that transmits and receives on the same wire such as 1000BaseT. The cancellation circuit 59 is not used when testing media that transmits and receives on different wires such as in 10/100BaseT. The cancellation circuit 59 can be a hybrid circuit.

Figure 3:
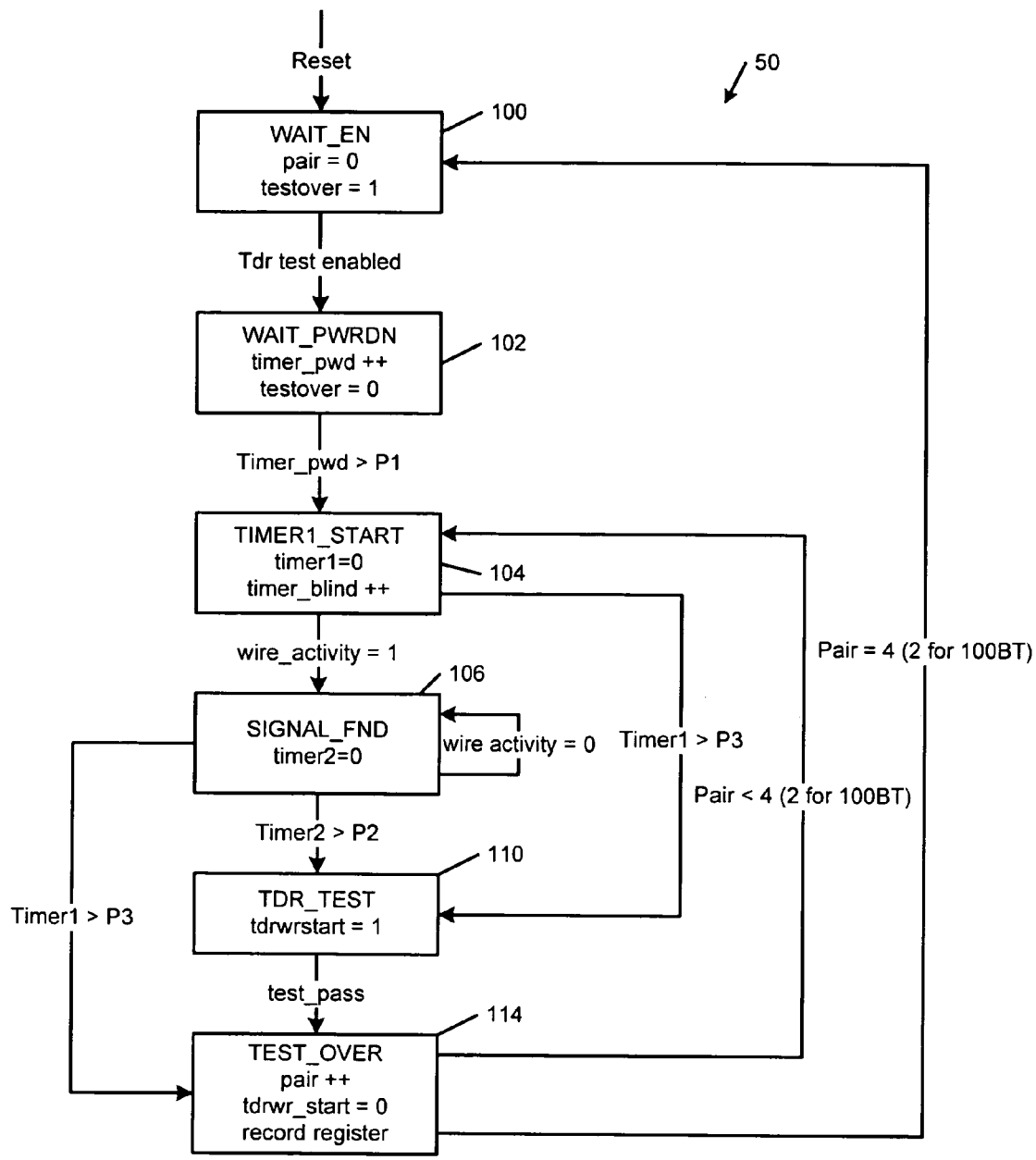
FIG. 3 is a state diagram of a pretest state machine.

Referring now to FIG. 3, the pretest state machine 50 is illustrated in further detail. On reset, the pretest state machine 50 moves to a wait enable state 100. Pair is set equal to zero and testover is set equal to one. When a test enabled signal is received, the pretest state machine 50 transitions to a wait powerdown state 102. A powerdown timer is incremented and test_over is set equal to zero. The powerdown timer should have a period that is sufficient to bring a link down. When the powerdown timer exceeds a first period P1, the pretest state machine 50 transitions to a first timer start state 104.

A first timer is set equal to zero and a blind timer is incremented. The blind timer waits for a blind timer period to allow a sufficient amount of time for transitions between pairs. Typically several clock cycles are sufficient. When wire_activity is high, the pretest state machine 50 transitions to a signal find state 106 and resets a second timer. Wire_activity is present when a signal on the wire is above a predetermined threshold.

When wire_activity is low in the signal find state 106, the pretest state machine 50 transitions back to the signal find state 106 and resets the second timer. If the second timer is greater than a second period P2, the pretest state machine 50 transitions to a test state 110. Tdrwrstart is set equal to one. If a test pass signal is received, the pretest state machine 50 transitions to a test over state 114. Pair is incremented, tdrwrstart is set equal to zero, and the register is recorded.

If pair is less than 4 for 1000BaseT operation or 2 for 10/100BaseT operation, the pretest state machine 50 transitions from the test over state 114 to the first timer start state 104. If pair is equal to 4 for 1000BaseT operation or 2 for 10/100BaseT operation, the pretest state machine 50 transitions from the test over state 114 to the wait enable state 100.

In the first timer start state 104, the pretest state machine 50 transitions to the test state 110 if the first timer is greater than a third period P3. In the signal find state 106, the pretest state machine 50 transitions to the test over state 114 if the first timer is greater than the third period P3.

In a preferred embodiment, the first period P1 is preferably 1.5 s, the second period P2 is equal to 5 ms, and the third period is equal to 125 ms. Skilled artisans will appreciate that the first, second and third periods P1, P2 and P3, respectively, may be varied. The P3 is preferably selected based on a worst case spacing of link pulses. P2 is preferably selected to allow testing between fast link pulses (FLP). FLP bursts have a length of 2 ms and a spacing of 16 ms. By setting P2=5 ms, the delay is a total of 7 ms, which is approximately half way between FLPs. P1 may be longer than 1.5 seconds if required to bring the link down.

Figure 4:
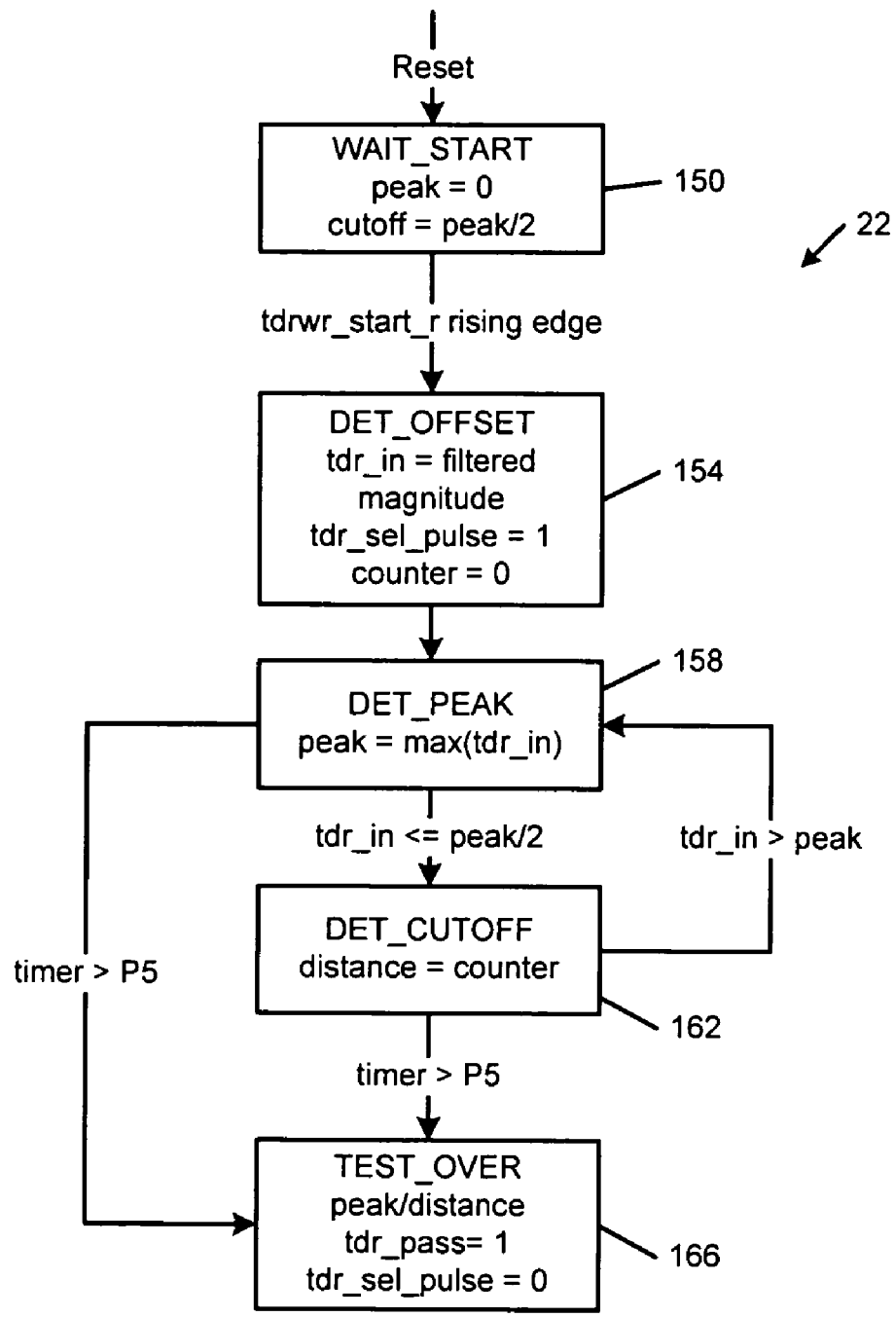
FIG. 4 is a state diagram of a first test state machine for a cable tester for a media that transmits and receives on the same wire.

Referring now to FIG. 4, the first test state machine 52 for media that transmits and receives on the same wire is shown. The cancellation circuit 59 cancels the transmit test pulse. On reset, the first test state machine 52 transitions to a wait start state 150. Peak is set equal to zero and cutoff is set equal to peak/2. When tdrwr_start_r rising edge is received from the pretest state machine 50, the first test state machine 52 transitions to a detect offset state 154. tdr_sel_pulse is set equal to 1 to generate a pulse and start a timer. The pulse is preferably a 128 ns pulse having a 2V amplitude.

After an offset is subtracted from tdr_in, the first test state machine 52 transitions to a detect peak state 158. Peak stores the current value of tdr_in. If tdr_in is less than or equal to peak/2, the first test state machine 52 transitions to a detect cutoff state 162 where distance is set equal to a counter. If tdr_in is greater than peak, the first test state machine 52 transitions to state 158 and peak is replaced by a new tdr_in. If a timer is greater than a fifth period P5, the first test state machine 52 transitions to a test over state 166 where peak/distance is calculated, tdr_pass is set equal to 1, and tdr_sel_pulse is set equal to 0.

While in the detect cutoff state 162, the first test state machine 52 transitions to the detect peak state 158 if tdr_in>peak. While in the detect peak state 158, the first state machine 52 transitions to the test over state 166 if the timer is greater than the fifth period P5. In a preferred embodiment, P5 is equal to 5 $\mu$s.

Figure 5:
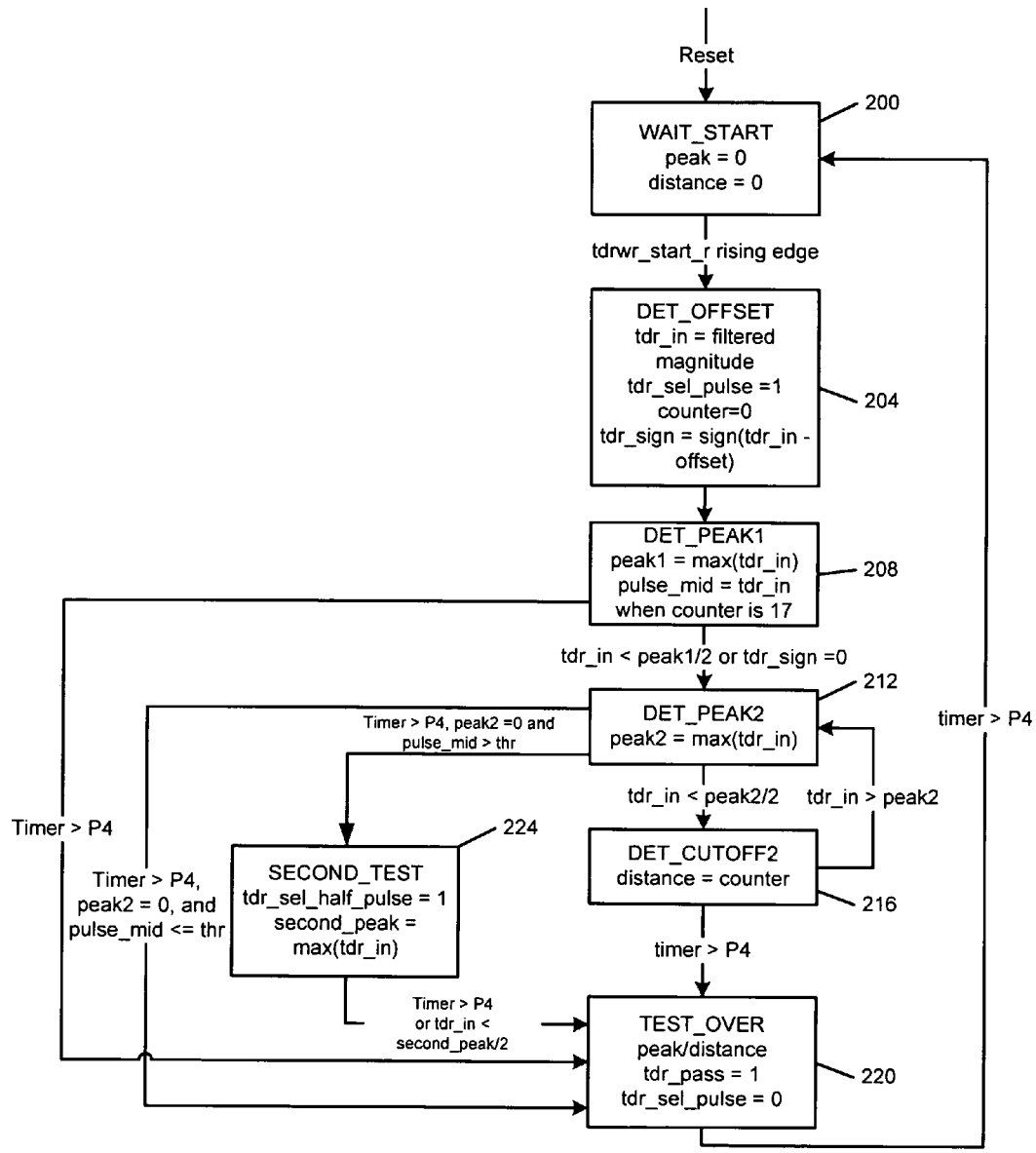
FIG. 5 is a state diagram of a second test state machine for a cable tester for a media that does not transmit and receive on the same wire.

Referring now to FIG. 5, the second test state machine 54 is shown in further detail. On reset, the second test state machine 54 transitions to a wait start state 200. Peak is set equal to zero, cutoff is set equal to peak/2, and distance is set equal to 0. When tdrwr_start_r rising edge is received from the pretest state machine 50, the second test state machine 54 transitions to a detect offset state 204 where tdr_in=filtered magnitude and tdr_sel_pulse is set equal to 1. The second test state machine 54 transitions to a first detect peak state 208 where peak1 is set equal to max of tdr_in.

If tdr_in is less than peak1/2, the second test state machine 54 transitions to a second detect peak state 212 and sets peak2 equal to maximum of tdr_in. If tdr_in is less than peak2/2, the second test state machine 54 transitions to a detect cutoff state 216. Distance is set equal to a counter. If a fourth timer is greater than a fourth period P4, the second test state machine 54 transitions to a test over state 220. Peak/distance is calculated, tdr_pass is set equal to 1, and tdr_sel_pulse is set equal to 0.

In the detect cutoff state 216, if tdr_in is greater than peak2, the second test state machine 54 transitions to the second peak detect state 212. In the second detect peak state 212, if the fourth timer is greater than P4, peak2 is equal to 0 and peak1 is greater than a threshold, the second test state machine 54 transitions to a second test state 224. In the second test state 224, tdr_sel_half_pulse is set equal to 1 to send a half pulse. The second test state machine 54 transitions from the second test state 224 to the test over state 220.

In the first detect peak state 208, if the fourth timer is greater than P4, the second test state machine 54 transitions to the test over state 220. In the second detect peak state 212, if the fourth timer is greater than P4, peak2=0, and peak1 is less than or equal to a second threshold, the second test state machine 54 transitions to the test over state 220.

The link is brought down and the pretest state machine 50 waits until the line is quiet. For each pair, the cable tester 20 generates a TDR pulse and measures the reflection. In 10/100BaseT media, after the test is enabled, the pretest state machine 50 waits until the line is quiet. A pulse is generated and the reflection is measured. The status receiver and transmitter pairs are determined sequentially. For the first pair, the receiver is preferably in MDIX mode and the transmitter is preferably in MDI mode. For the second pair, the receiver is preferably in MDI mode and transmitter is preferably in MDIX mode.

The pretest state machine 50 ensures that the line is quiet before the pulse is transmitted. After the test is enabled, the pretest state machine 50 waits P1 (such as 1.5 seconds or longer) to make sure that the link is brought down. The pretest state machine 50 determines whether there is activity on a first pair (MDI+/−[0] for 1000BaseT network devices and RX for 10/100BaseT products).

In a preferred embodiment, activity is found when activity minus systemic offset such as a noise floor that is calculated in states 154 and 204 is greater than a predetermined threshold. If there is no activity for P2 (such as 125 ms), the pretest state machine 50 proceeds to the test state and sends a pulse on the selected pair. If there is activity on the pair and the line is quiet for 5 ms afterwards, the pretest state machine proceeds to the test state. The test fail state is reached and a test failure declared if the line has not been quiet for more than 5 ms during a 125 ms period. If a test failure is declared on the first pair or the TDR test is completed for the pair, the same procedure is conducted on MDI+/−[1], MDI+/−[2], MDI+/−[3] sequentially for 1000BaseT devices and the TX pair for 10/100BaseT devices.

In 1000BaseT devices, the original 128 ns test pulse is cancelled by the cancellation circuit 59. The pulse received at the ADC output is the reflection. The test pulse preferably has 2V swing. Before testing, the offset on the line is measured and is subtracted from the received ADC value.

Figure 6:
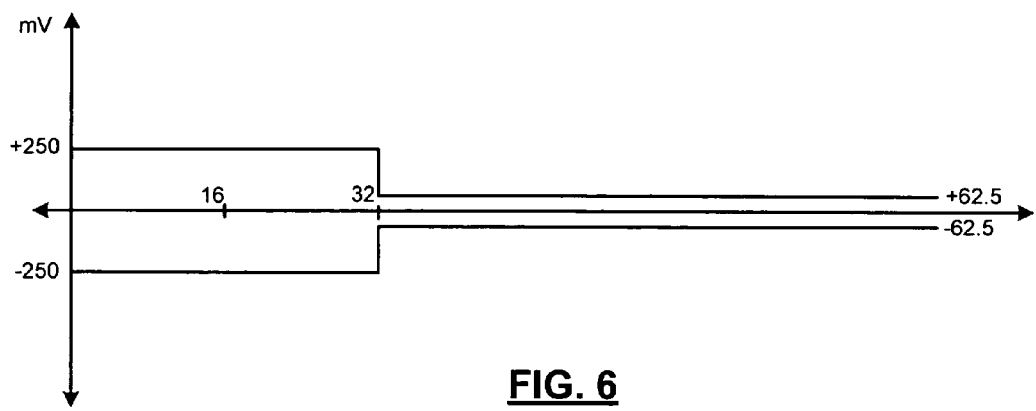
FIG. 6 is a waveform diagram illustrating a time-based receiver floor.
Figure 7:
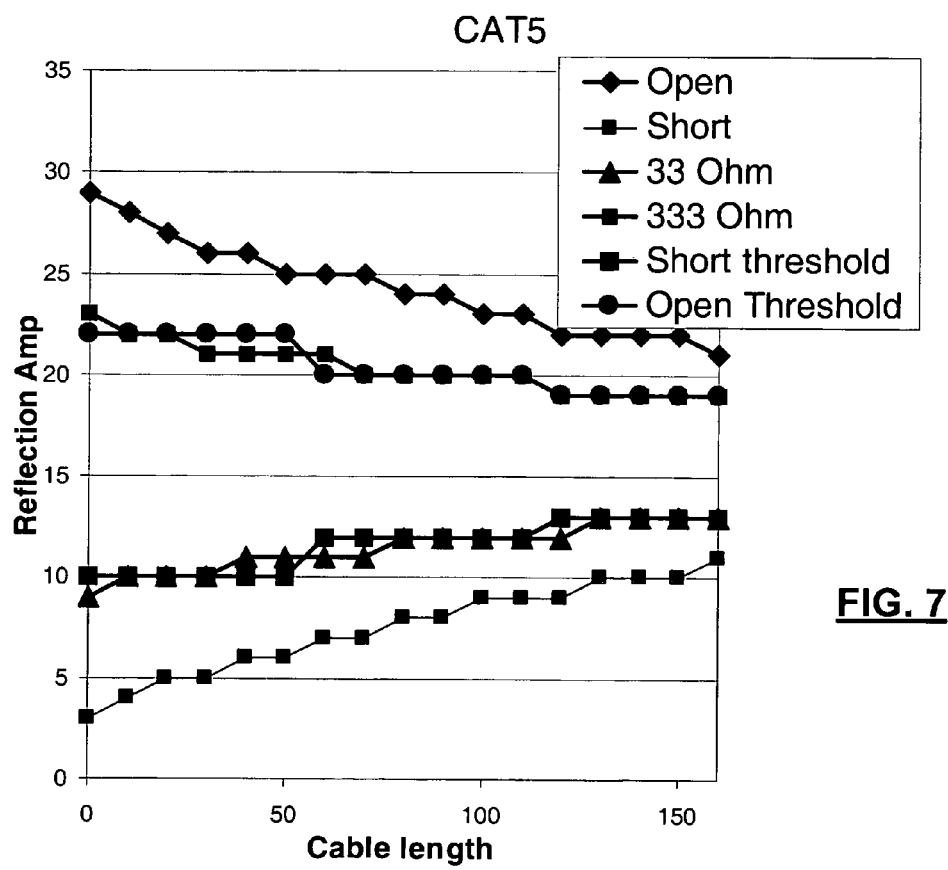
FIG. 7 is an exemplary cable reflection amplitude vs. cable length relationship for a first type of cable.

Referring now to FIG. 6, the cancellation circuit 59, which can be an analog hybrid circuit, does not perfectly cancel the test pulse. To prevent false reflection identification, a 250 mv floor within 32 clock cycles (125 Mhz clock) and a 62.5 mv floor after 32 clock cycles are used to allow a residual of cancellation of the test pulse and noise to be filtered. The peak value on the line is detected for 5 $\mu$s. The amplitude of reflection is the maximum magnitude that is detected. The amplitude is adjusted according to the sign of the reflection. The distance to the reflection is located at 50% of the peak.

The cable status is determined by comparing the amplitude and the calculated cable length to the lookup table 56 for the type of cable being tested. The measured reflection amplitude falls into a window. There are two adjustable thresholds for open circuit and short circuit cable. The open threshold is preferably based on experimental data, which can be produced by refection amplitudes for CAT3 and CAT5 cable that is terminated with a first impedance value such as 333 Ohms.

The default short circuit threshold is based on experimental data of refection amplitudes for CAT3 and CAT5 cable that is terminated with a second impedance value such as a 33 Ohms. As can be appreciated, the lookup table 56 may contain data for other cable types. Other impedance values may be used to generate the thresholds.

If measured amplitude falls between open and short circuit thresholds, the cable status is declared normal. If the amplitude is above the open threshold, the cable status is declared an open circuit. If the amplitude is below a short circuit threshold, the cable status is declared a short circuit. The cable status, reflection amplitude and cable distance are stored and/or displayed.

In the second test state machine, the original test pulse is not cancelled. Both the original pulse and the reflection are monitored. When an open circuit is located near the cable tester, the two pulses may be overlapping, which may cause saturation in the ADC. The test state machine preferably sends out a 128 ns pulse that has a 1V swing. The offset on the line is measured and subtracted from the received ADC value. A 250 mv floor is used within 32 clock cycles (125 Mhz clock) and a 62.5 mv floor is used after 32 clock cycles so that the residual of cancellation and noise can be filtered. Signals below the floor are considered to be 0. The peak value on the line is detected for 5 $\mu$s. As can be appreciated, the test pulse can have longer or shorter durations and amplitudes.

The first peak that is observed should be the test pulse. The amplitude of reflection is the maximum magnitude detected after the test pulse is detected. The distance of reflection is at 50% cutoff of the peak. If another pulse is not detected after the test pulse and the magnitude of the test pulse (when a counter reached a predetermined period) is greater than a preset threshold, the cable tester decides whether there is an open cable that is located relatively close or a perfectly terminated cable by sending a second test pulse that has one-half of the magnitude of the first test pulse.

If the maximum magnitude on the line is greater than ¾ of the original pulse, there is an open circuit that is located relatively close. Otherwise, if the first peak is detected after a predetermined number of clock cycles, the cable tester 20 declares an open circuit. If the first peak is within after the predetermined number of clock cycles, the cable tester 20 declares a perfectly terminated cable. In one exemplary embodiment, the predetermined number of clock cycles is 33.

The cable status is determined by comparing the amplitude and distance of reflection to the lookup table 56 based on the type of cable being tested. There are two adjustable thresholds for open and short circuit cable. The default open threshold is from the experimental data of refection amplitudes for CAT3 and CAT5 cable terminated with a first impedance value such as 333 Ohms. The default short circuit threshold is from the experimental data of refection amplitude of CAT3 and CAT5 cable that is terminated with a second impedance value such as 33 Ohms. Other impedance values may be employed for generating thresholds.

If the measured amplitude falls between open and short circuit thresholds, the cable status is declared normal. If the amplitude is above the open circuit threshold, the cable status is declared an open circuit. If the amplitude is below a short circuit threshold, the cable status is declared a short circuit. The cable status, reflection amplitude and cable length are stored and/or displayed.

Figure 8:
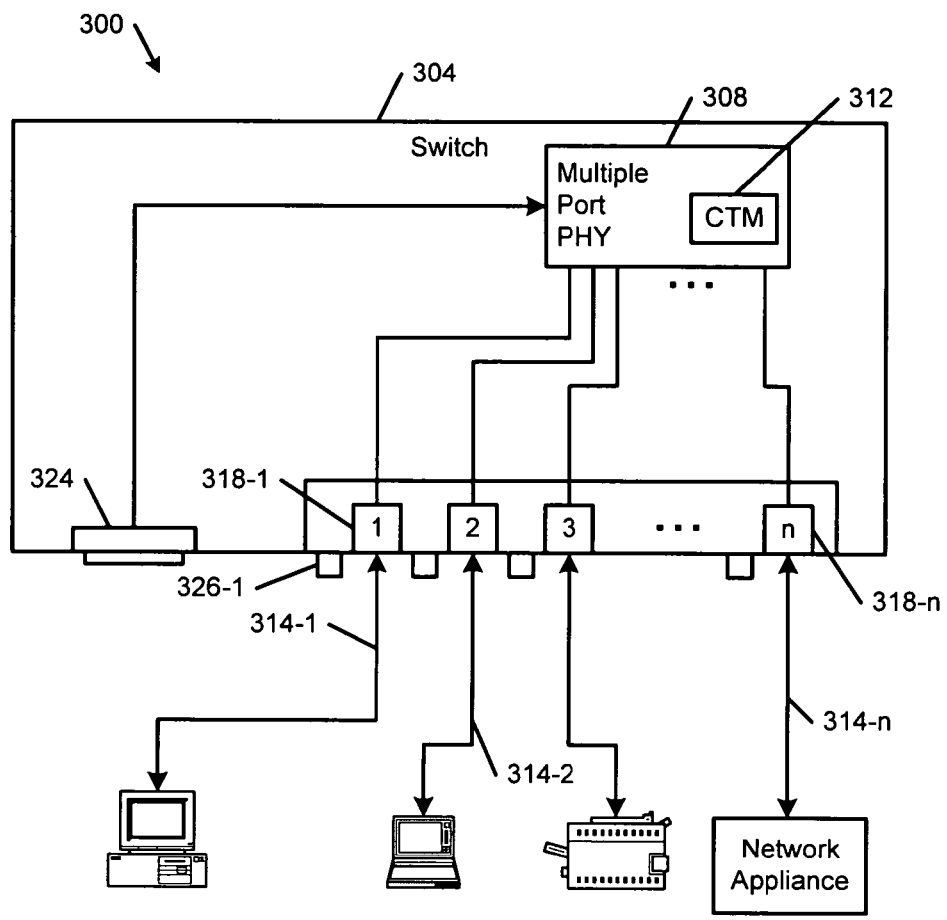
FIG. 8 is a functional block diagram of an exemplary network device that includes one or more physical layer devices and that includes a hardware or software based cable testing switch for initiating cable testing.

Referring now to FIG. 8, the cable tester can be implemented in an exemplary network device 300 that includes a physical layer device 308 and a cable tester or cable test module (CTM) 312, as described above. The network device 300 can be a switch 304 that includes an n port physical layer device 308 and a cable test module (CTM) 312. While the switch 304 is shown, any other network device 300 that contains a physical layer device, a port and the CTM can be used. For example, the network device 300 may be a network appliance, a computer, a switch, a router, a fax machine, a telephone, a laptop, etc.

Cables 314-1, 314-2, . . . , and 314-n can be connected to the switch 304 using connectors 318-1, 318-2, . . . , and 318-n, such as RJ-45 connectors or any other suitable connector type. The switch 304 can be connected to other network devices such as, but not limited to, computers, laptops, printers, fax machines, telephones and any other network device or network appliance.

In the embodiment shown in FIG. 8, the network device 300 includes a software or hardware based switch 324 that is used to trigger the cable test during operation. The network device 300 also includes one or more light emitting diodes (LEDs) 326-1, 326-2, . . . , and 326-n. If a single LED per port is used, the LEDs 326 are fully burdened during normal use. For example, the LEDs 326 are used to display the presence or absence of a link, link speed, link activity and other information during normal (non-cable-testing) use. While LEDs are shown, any other audio and/or visual indicator can be used. For example, audible tones from a speaker or other audio device can be used to indicate cable status. If the network device includes illuminated switches, the illumination of the switches can be flashed, brightened, dimmed or otherwise used to indicate cable status. Still other indicators include incandescent lights.

Figure 9:
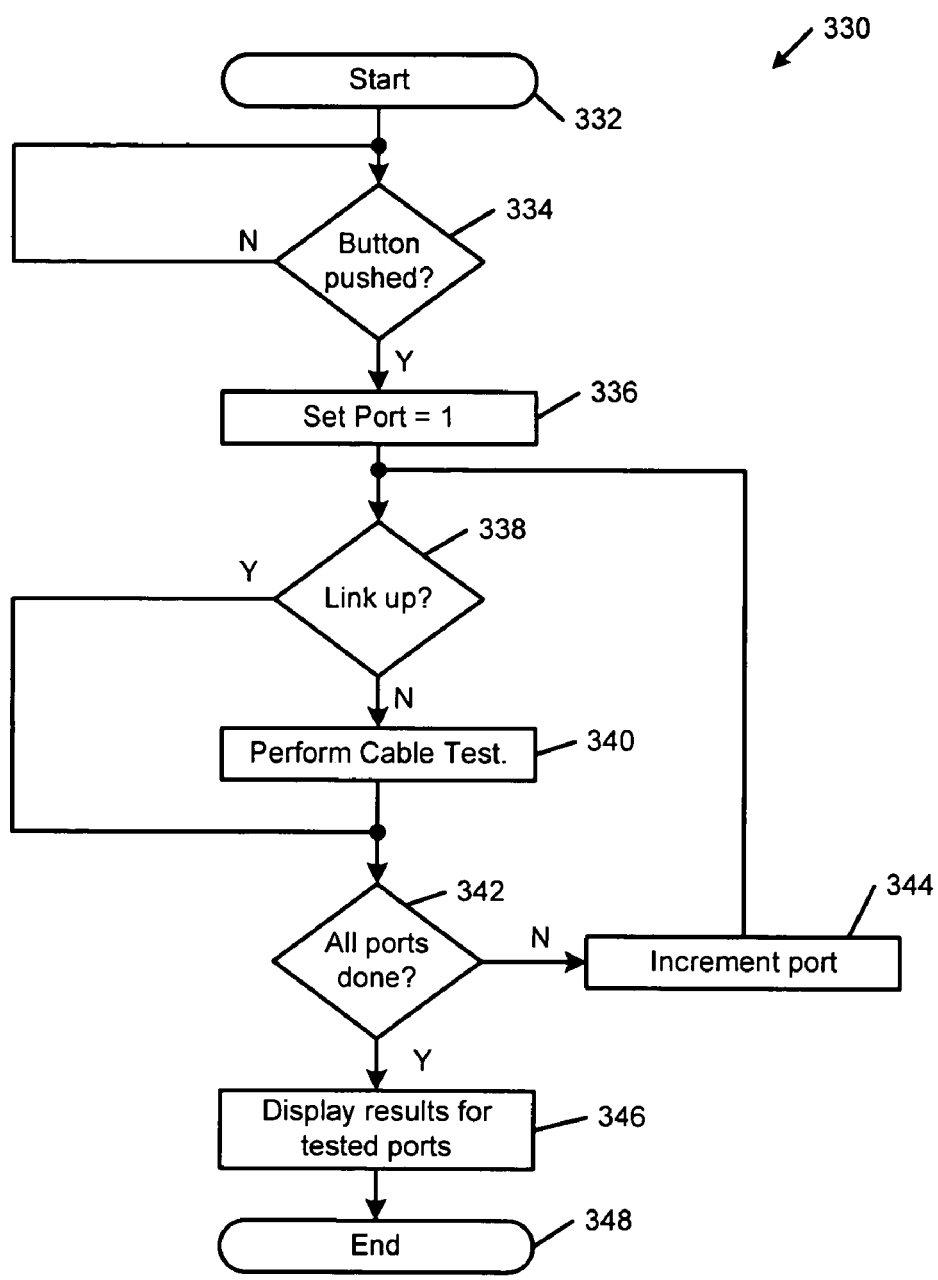
FIG. 9 is a flowchart illustrating steps for performing a cable test for the exemplary network device in FIG. 8.

Referring now to FIG. 9, steps for operating the network device 300 are shown generally at 330. Control begins with step 332. In step 334, control determines whether the test switch 324 has been pushed. If the test switch has not been pushed, control loops back to step 334. Otherwise, control continues with step 336 where control sets the port equal to 1.

Control determines whether the link associated with a current port is up in step 338. If not, control performs the cable test on the designated port in step 340. Control continues from step 340 or step 338 (if true) with step 342 where control determines whether all ports have been tested. If not, control continues with step 344, increments the port, and continues with step 338. If all ports are tested as determined in step 342, control displays the results for the tested port(s) in step 346 using the LEDs and control ends in step 348. If the network device 300 has only one port, steps 336, 342 and 344 can be skipped. As can be appreciated by skilled artisans, the cable test can be executed sequentially for each port as set forth above or simultaneously for all ports.

Figure 10A:
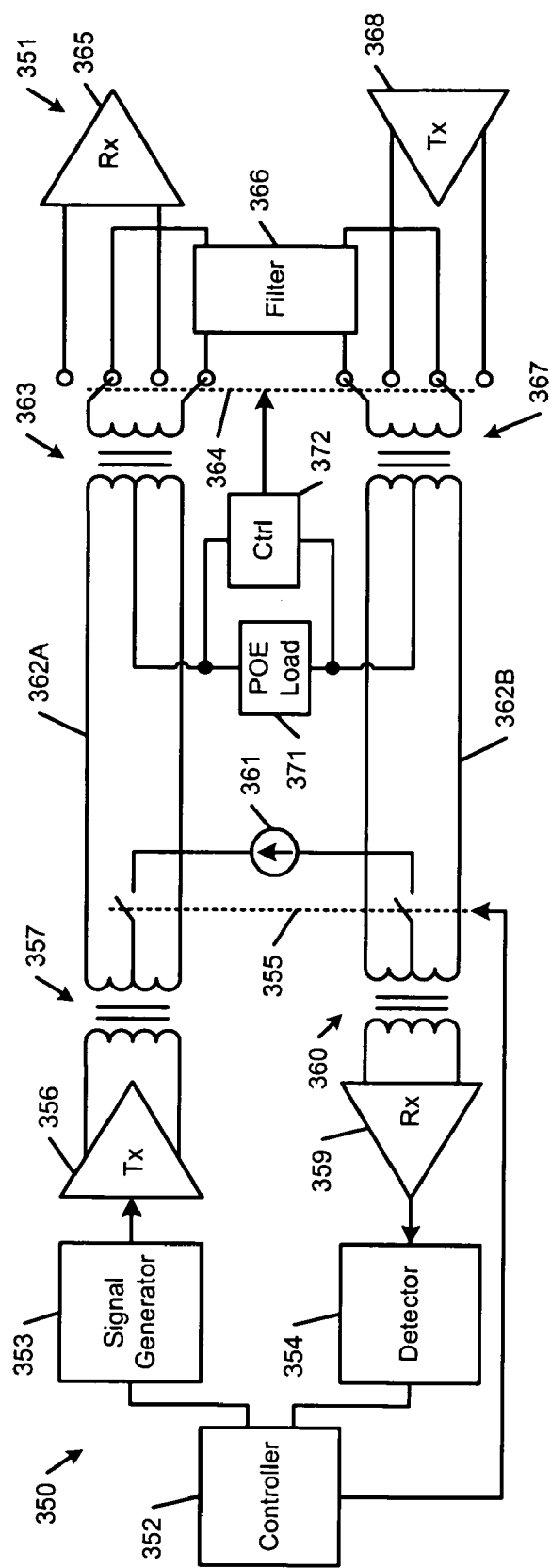
FIG. 10A is a functional block diagram of an exemplary power over Ethernet (POE) device.
Figure 10B:
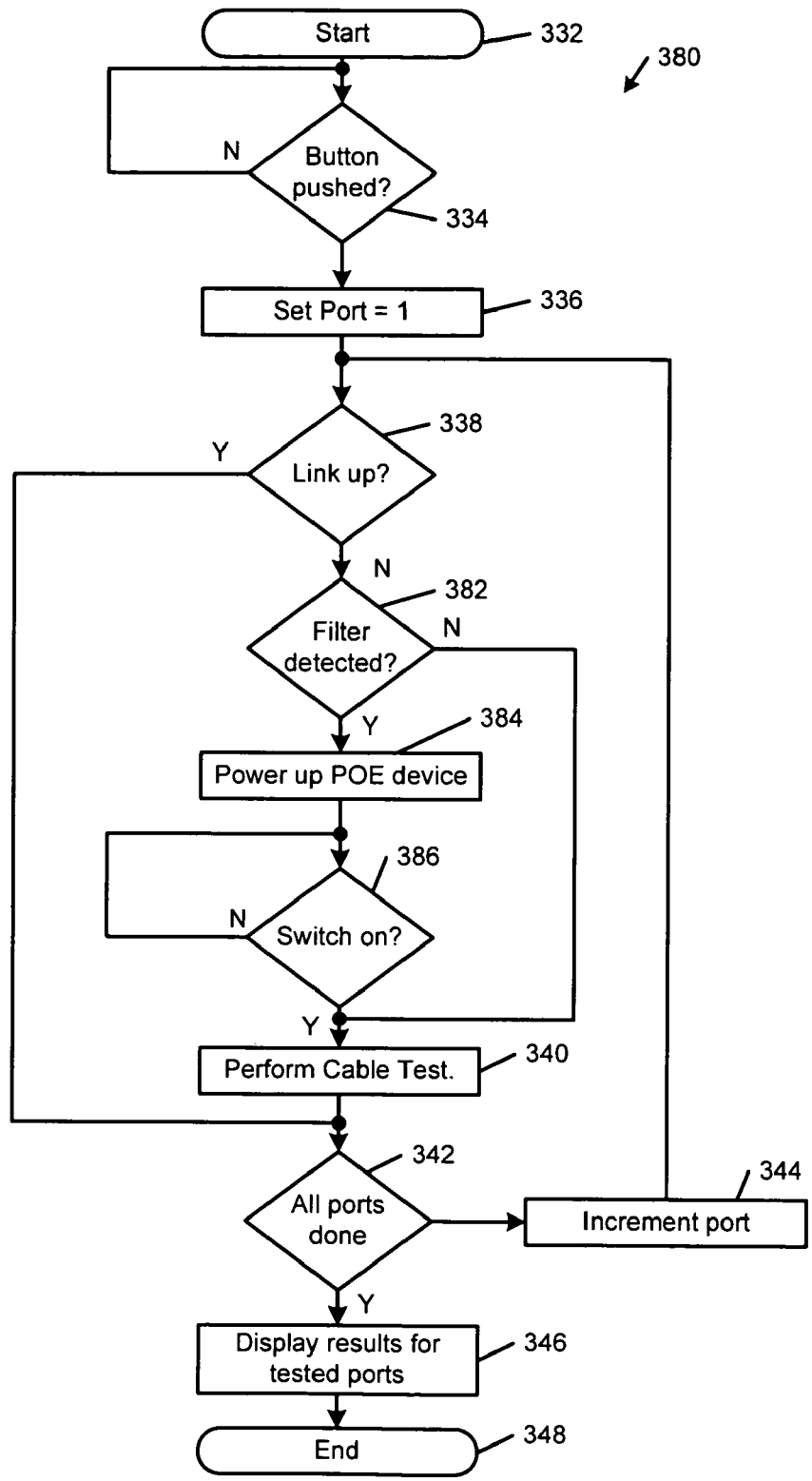
FIG. 10B is a flowchart illustrating steps for performing a cable test for the exemplary network device in FIG. 8 when POE devices are possibly connected at remote cable ends.

Referring now to FIGS. 10A and 10B, additional steps are performed when the network device may be connected to power over Ethernet (POE) devices or data terminal equipment (DTE), which will be collectively referred to herein as POEs. Examples of POEs include computers (notebooks, servers and laptops), equipment such as smart videocassette recorders, IP telephones, fax machines, modems, televisions, stereos, hand-held devices, or any other network device requiring power to be supplied over the cable. These devices typically include a filter or other circuit that is connected across center taps of transformers at the POE end of the cable. If not accommodated by the cable test module, the filters or other circuits that are used by the POEs may cause the cable test to generate inaccurate results.

Referring now to FIG. 10A, an exemplary network device 350 provides cable power to an exemplary cable-powered POE 351. The network device 350 includes a controller 352 that communicates with a signal generator 353, a detector 354 and a selector switch 355. The signal generator 353 communicates with a transmitter 356 having an output that communicates with a secondary of a transformer 357. The detector 354 communicates with a receiver 359 having an input that communicates with a secondary of a transformer 360. The selector switch 355 selectively connects center taps of primaries of the transformers 357 and 360 to a power source 361.

Pair A of a cable 362 communicates with a primary of a transformer 363. A secondary of the transformer 363 communicates with a selector switch 364, which selects either a receiver 365 or a filter 366. Pair B of the cable 362 communicates with a primary of a transformer 367. A secondary of the transformer 367 communicates with the selector switch 364, which selects either the transmitter 368 or the filter 366.

A load 371 and a controller 372 are connected across center taps of the primaries of the transformers 363 and 367. The load 371 includes, for example, the load of the receiver 365, the transmitter 368 and other circuits in the cable-powered POE device 351. The controller 372 controls the position of the selector switch 364. In a de-energized state or when power is not supplied over data the cable 362, the selector switch 364 connects the secondaries of the transformer 363 and 367 to the filter 366. Typically the filter 366 is a low-pass filter.

The controller 372 detects when the network device 350 supplies power to the cable 362. Since the load 371 is in parallel with the controller 372, power is also supplied to the load 371 at the same time as power is supplied to the controller 372. When power is supplied to the controller 372, the selector 364 is controlled to connect the secondary of the transformer 363 to the receiver 365 and the secondary of transformer 367 to the transmitter 368. At substantially the same time, power is supplied to the receiver 365, the transmitter 368 and the other circuits of cable-powered POE device 351. At this point, the cable-powered POE device 351 can begin autonegotiating with the network device 350.

The cutoff frequency of the low-pass filter 366 filters out fast link pulses (FLPs). Without the filter 366, when the POE 351 communicates with a non-POE enabled network device, the FLPs generated by the non-POE network device could be sent back to the non-POE network device. The non-POE network device may receive the FLPs that it sent and attempt to establish a link with itself or cause other problems. The filter 366 will also adversely impact the cable test. Thus, the network device 350 transmits test signals having pulse widths greater than FLPs, which will pass through the low-pass filter 352. Once the selector switch closes, the network device 350 performs cable testing.

For additional details concerning these and other POE devices, see "Method and Apparatus for Detecting and Supplying Power by a First Network Device to a Second Network Device", U.S. patent application Ser. No. 10/098, 865, filed Mar. 15, 2002, and "System and Method for Detecting A Device Requiring Power", WO 01/11861, filed Aug. 11, 2000, which are both incorporated by reference in their entirety.

Referring now to FIG. 10B, steps for performing the cable test when the network device may be connected to POE devices are shown generally at 380. Common steps from FIG. 9 have been identified using the same reference number. If the link is not up in step 338, control continues with step 382 where control determines whether the filter 366 is detected. Is false, control continues with step 340 as described above. If the filter 366 is detected, control powers up the POE device in step 384. In step 386, control determines whether the selector switch 355 is on. If not, control loops back to step 386. Otherwise, control continues with step 340 as described above.

Figure 11:
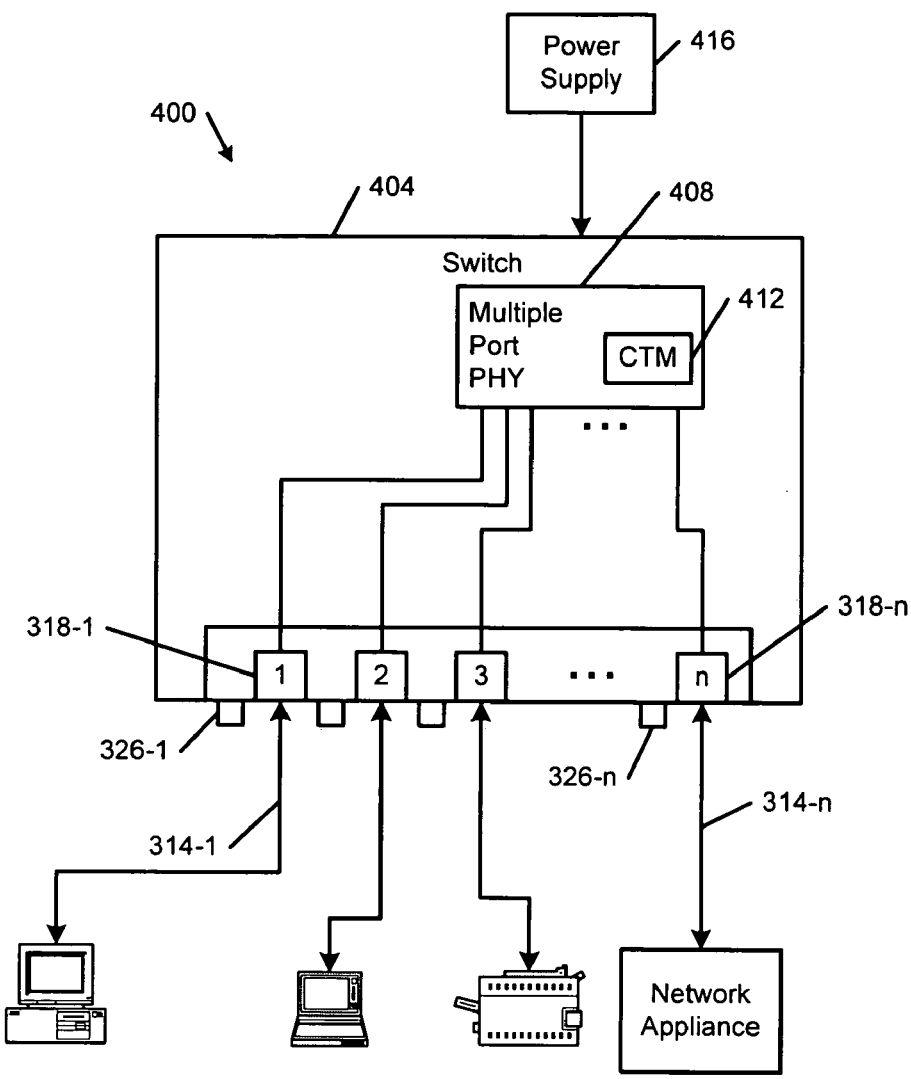

Referring now to FIG. 11, a network device 400 includes a physical layer device 408 and a cable tester 412, as described above. For example, the network device 400 can be a switch 404 that includes an n port physical layer device 408 and a cable test module (CTM) 412. However, any other network device that contains a physical layer device can be used. Cables 314-1, 314-2, . . . , and 314-n can be connected to the switch 404 using connectors 318-1, 318-2, . . . , and 318-n, such as RJ-45 connectors or any other suitable connector type. The switch 404 can be connected to other network devices such as, but not limited to, computers, laptops, printers, fax machines, telephones and any other network device or POE. In the embodiment shown in FIG.

11, the network device 400 initiates the cable test when powered on by a power supply 416. The cable test can be initiated manually and/or automatically on power up. The network device 400 also includes one or more LEDs 326-1, 326-2, . . . , and 326-n.

Figure 12:
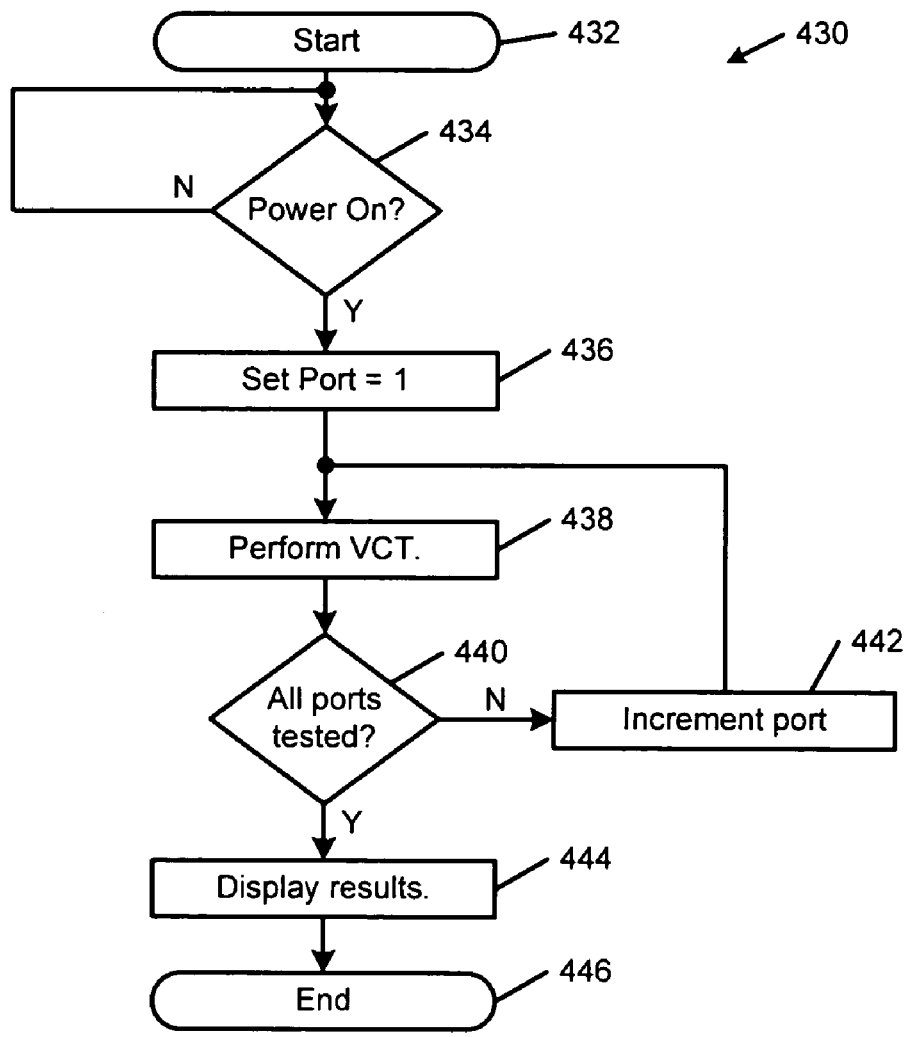
FIG. 12 is a flowchart illustrating steps for performing a cable test for the exemplary network device in FIG. 11.

Referring now to FIG. 12, steps for operating the network device 400 are shown generally at 430. Control begins with step 432. In step 434, control determines whether power is on. When power is on, control sets a port equal to 1 in step 436. In step 438, control performs the cable test as described above. In step 440, control determines whether all of the ports have been tested. If not, control increments the port and returns to step 438. If the network device has only one port, the steps 436, 440 and 442 may be skipped. Otherwise, control displays the results in step 444 and control ends in step 446. As can be appreciated by skilled artisans, the cable test can be executed sequentially for each port as set forth above or simultaneously for all ports.

Figure 13:
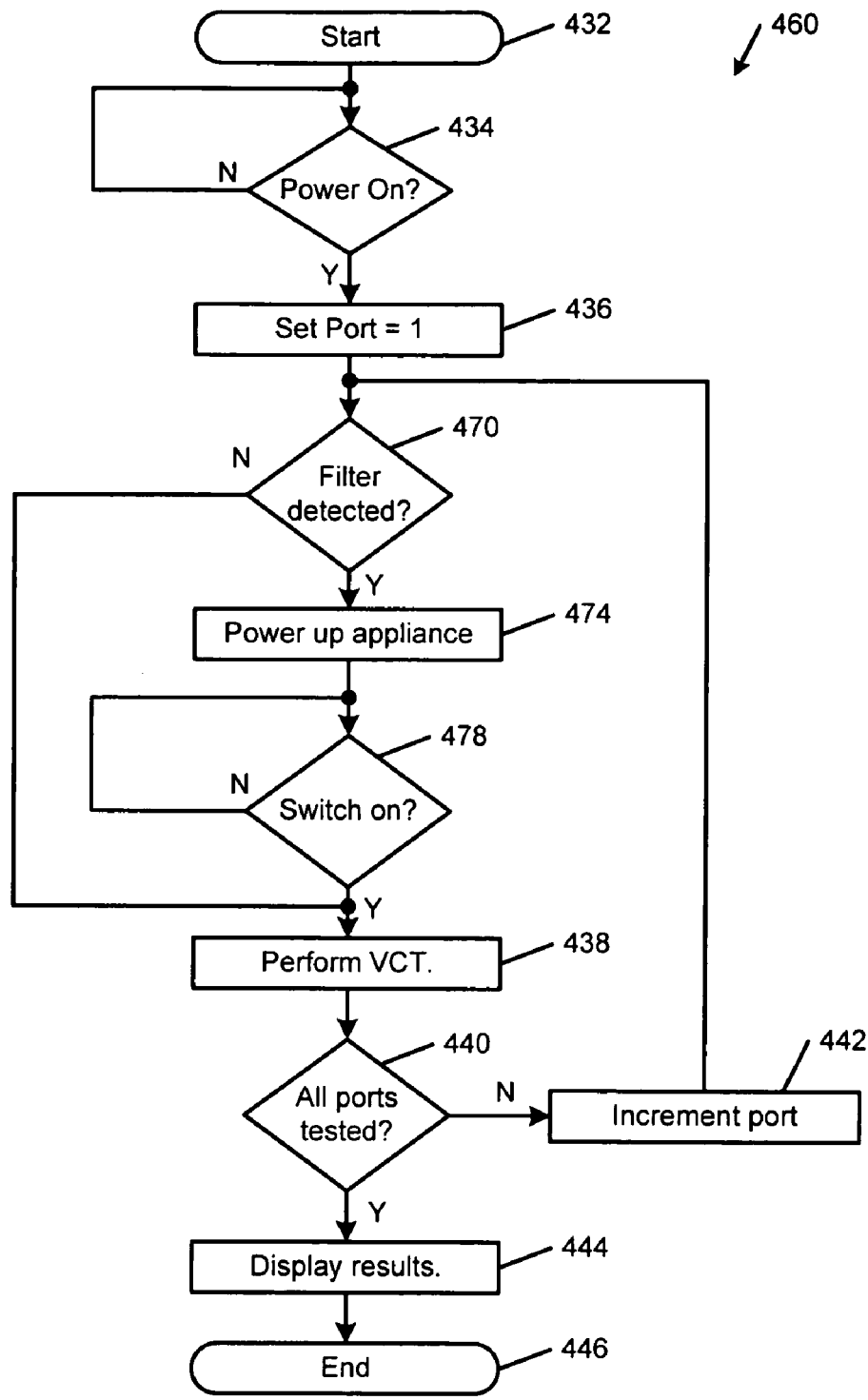
FIG. 13 is a flowchart illustrating steps for performing a cable test for the exemplary network device in FIG. 11 when POE devices are possibly connected at remote cable ends.
Figure 14A:
FIGS. 14A–14E illustrate exemplary LEDs during testing cable testing.
Figure 14B:
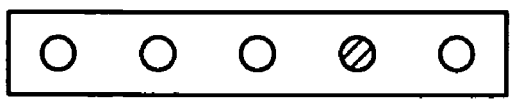
Figure 14C:
Figure 14D:
Figure 14E:

Referring now to FIG. 13, additional steps are performed when the network device may be connected to power over Ethernet (POE) devices as shown generally at 460. Common steps from FIG. 12 have been designated using the same reference number. In step 470, control determines whether the filter 466 is detected. If false, control continues with step 438 as described above. If a filter is detected, control powers up the POE device in step 474. In step 478, control determines whether the switch is on. If not, control loops back to step 478. Otherwise, control continues with step 438 as described above.

Referring now to FIGS. 14A–14E, control successively tests each port. Each port may be associated with one or more LEDs. During normal operation, the LEDs are used to indicate the presence or absence of a link, link activity, link speed or any other information. These same LEDs are also used to indicate testing in progress and the results of the cable test. As can be appreciated, other than the addition of the cable test module, no other hardware needs to be added.

Figure 15:
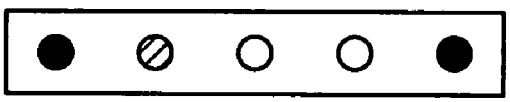
FIG. 15 illustrates the exemplary LEDs showing the results of cable testing.
Figure 16:
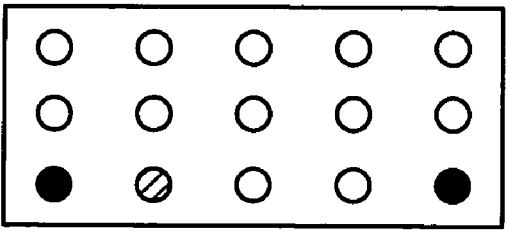
FIG. 16 illustrates exemplary LEDs of a network device that includes more than one LED per port.

When testing, the CTM may optionally turn on, turn off, or blink one or more of the LEDs to designate that a cable test is occurring on the associated port. Each of the ports are tested one or more times sequentially, randomly or in any order. When the tests are complete, the network device indicates the results using the LEDs, for example as shown in FIG. 15. For example, turning on the LED associated with a port indicates that a good cable communicates with the port. Turning the LED off indicates an open circuit. Blinking the LED indicates a short. As can be appreciated, the on, off and blinking states or speed and LED color can be assigned in a different manner to cable states of good, open, and short. The LEDs can be monochrome or color. Color LEDs can be used to indicate additional information such as the relative location of the failure (such as near, intermediate, far or other distance ranges), the identification of the signal pair with the fault, whether the fault relates to impedance mismatch, and/or the magnitude of the measured impedance (such as low, medium, high, open). By using existing, fully burdened LEDs to indicate the results of the cable test, the present invention provides lower cost network devices with built-in cable testing. While only one LED per port is shown in FIGS. 14 and 15, the network device may also include additional LEDs that are associated with each port as shown in FIG. 16.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A physical layer device that is adapted to communicate with a cable medium and that communicates with an indicator, comprising:
   a first input/output terminal;
   a first transceiver that communicates with said first input/output terminal that is adapted to be connected to a cable medium; and
   a cable tester that tests the cable medium and determines a cable status using a pretest module that senses activity on the cable medium and enables testing if activity is not detected for a first period, and a test module that is enabled by said pretest module, transmits a test pulse on the cable medium, measures a reflection amplitude and calculates a cable length,
   wherein said cable tester determines said cable status based on said measured amplitude and said calculated cable length, and
   wherein the indicator indicates at least one of cable testing status during said test and said cable status after said test, and
   wherein the indicator also indicates at least one of link presence, link absence, link activity, link duplex and link speed of said first input/output terminal during normal operation.

2. The physical layer device of claim 1 further comprising a lookup table that includes a plurality of sets of reflection amplitudes as a function of cable length, wherein said cable tester determines said cable status using said lookup table, said reflection amplitude and said cable length.

3. The physical layer device of claim 1 wherein said cable status includes good, open and short cable statuses.

4. The physical layer device of claim 1 wherein said physical layer device includes a plurality of input/output terminals and said cable tester includes a test actuator that triggers said cable test during operation of said physical layer device for unlinked input/output terminals but not linked input/output terminals.

5. The physical layer device of claim 1 wherein said cable tester enters a test fail status when the cable medium is active for a period greater than a test fail period.

6. The physical layer device of claim 1 wherein said cable tester is integrated with said first transceiver in a single integrated circuit.

7. The physical layer device of claim 1 further comprising:
   a detector that detects a power over Ethernet (POE) device;
   a power supply; and
   a switching device that selectively provides power from said power supply over the cable medium when said detector detects said POE device, wherein said cable tester delays testing of the cable medium when said detector detects said POE device until said switching device provides said power.

8. The physical layer device of claim 1 wherein said physical layer device forms part of one of a switch, a router, a computer, a laptop, a smart videocassette recorder, an IP telephone, a fax machine, a modem, a television, a stereo, and a hand-held device.

9. The physical layer device of claim 1 wherein the indicator includes at least one of an audio indicator and a visual indicator.

10. The physical layer device of claim 1 wherein the indicator includes at least one of a speaker, a light emitting diode (LED), and an incandescent light.

11. The physical layer device of claim 1 wherein said physical layer device is implemented in an Ethernet network device.

12. The physical layer device of claim 11 wherein said Ethernet network device operates at at least one 10 Megabits per second (Mbps), 100 Mbps and 1000 Mbps.

13. A physical layer device that is adapted to communicate with a cable medium and that communicates with an indicator, comprising:
   a first input/output terminal;
   a first transceiver that communicates with said first input/output terminal that is adapted to be connected to a cable medium; and
   a cable tester that tests the cable medium and determines a cable status using a pretest module that senses activity on the cable medium and enables testing if activity is not detected for a first period, and a test module that is enabled by said pretest module, transmits a test pulse on the cable medium, measures a reflection amplitude and calculates a cable length,
   wherein said cable tester determines said cable status based on said measured amplitude and said calculated cable length,
   wherein the indicator indicates at least one of cable testing status during said test and said cable status after said test, and
   wherein said pretest module enables testing if, during said first period, activity is detected and is subsequently not detected for a second period after said activity is detected.

14. A physical layer device that is adapted to communicate with a cable medium and that communicates with an indicator, comprising:
   a first input/output terminal;
   a first transceiver that communicates with said first input/output terminal that is adapted to be connected to a cable medium; and
   a cable tester that tests the cable medium and determines a cable status using a pretest module that senses activity on the cable medium and enables testing if activity is not detected for a first period, and a test module that is enabled by said pretest module, transmits a test pulse on the cable medium, measures a reflection amplitude and calculates a cable length,
   wherein said cable tester determines said cable status based on said measured amplitude and said calculated cable length, and
   wherein the indicator indicates at least one of cable testing status during said test and said cable status after said test;
   a lookup table that includes a plurality of sets of reflection amplitudes as a function of cable length, wherein said cable tester determines said cable status using said lookup table, said reflection amplitude and said cable length, and
   wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

15. The physical layer device of claim 14 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

16. The physical layer device of claim 15 wherein a third window is defined between said second and fourth thresholds.

17. The physical layer device of claim 16 wherein the cable medium is declared an open circuit when said reflection amplitude is in said first window for said cable length and wherein the cable medium is declared a short circuit when said reflection amplitude is in said second window for said cable length, and wherein the cable medium is declared normal when said reflection amplitude is in said third window for said cable length.

18. A physical layer device that is adapted to communicate with a cable medium and that communicates with an indicator, comprising:
   a first input/output terminal;
   a first transceiver that communicates with said first input/output terminal that is adapted to be connected to a cable medium; and
   a cable tester that tests the cable medium and determines a cable status using a pretest module that senses activity on the cable medium and enables testing if activity is not detected for a first period, and a test module that is enabled by said pretest module, transmits a test pulse on the cable medium, measures a reflection amplitude and calculates a cable length,
   wherein said cable tester determines said cable status based on said measured amplitude and said calculated cable length,
   wherein the indicator indicates at least one of cable testing status during said test and said cable status after said test;
   an analog to digital converter (ADC) that measures said reflection amplitude, wherein said test module measures offset at said ADC, subtracts said offset from said reflection amplitude, and zeroes said reflection amplitude below a floor, wherein said floor has a first value during a first period after said test pulse and a second value during a second period after said first period.

19. A physical layer device that is adapted to communicate with a cable medium and an indicator for providing one of audio and visual information, comprising:
   a first input/output terminal;
   first transceiver means for communicating with said first input/output terminal over a cable medium; and
   cable testing means for testing the cable medium and for determining a cable status using pretest means for sensing activity on the cable medium and enabling testing if activity is not detected for a first period, and test means that is enabled by said pretest means for transmitting a test pulse on the cable medium, for measuring a reflection amplitude and for calculating a cable length,
   wherein said cable testing means determines said cable status based on said measured amplitude and said calculated cable length, and wherein the indicator displays at least one of cable testing status during said test and said cable status after said test, and wherein the indicator also identifies at least one of link presence, link absence, link activity, link duplex and link speed of said first input/output terminal during normal operation.

20. The physical layer device of claim 19 further comprising lookup means for storing a plurality of sets of reflection amplitudes as a function of cable length, wherein said cable testing means determines said cable status using said lookup means, said reflection amplitude and said cable length.

21. The physical layer device of claim 19 wherein said cable status includes good, open and short cable statuses.

22. The physical layer device of claim 19 wherein said physical layer device includes a plurality of input/output terminals and said cable testing means includes test actuating means for triggering said cable test during operation of said physical layer device for unlinked input/output terminals but not linked input/output terminals.

23. The physical layer device of claim 19 wherein said cable testing means enters a test fail status when the cable medium is active for a period greater than a test fail period.

24. The physical layer device of claim 19 wherein said cable testing means is integrated with said transceiver in a single integrated circuit.

25. The physical layer device of claim 19 further comprising:
detecting means for detecting a power over Ethernet (POE) device;
power supply means for supplying power; and
switching means for selectively providing power from said power supply means over the cable medium when said detecting means detects said POE device, wherein said cable testing means delays testing of the cable medium when said detecting means detects said POE device until said switching means provides said power.

26. The physical layer device of claim 19 wherein said physical layer device forms part of one of a switch, a router, a computer, a laptop, a smart videocassette recorder, an IP telephone, a fax machine, a modem, a television, a stereo, and a hand-held device.

27. The physical layer device of claim 19 wherein the indicator includes at least one of an audio indicator and a visual indicator.

28. The physical layer device of claim 19 wherein the indicator includes at least one of a speaker, a light emitting diode (LED), and an incandescent light.

29. The physical layer device of claim 19 wherein said physical layer device is implemented in an Ethernet network device.

30. The physical layer device of claim 29 wherein said Ethernet network device operates at at least one 10 Megabits per second (Mbps), 100 Mbps and 1000 Mbps.

31. A physical layer device that is adapted to communicate with a cable medium and an indicator for providing one of audio and visual information, comprising:
a first input/output terminal;
first transceiver means for communicating with said first input/output terminal over a cable medium; and
cable testing means for testing the cable medium and for determining a cable status using pretest means for sensing activity on the cable medium and enabling testing if activity is not detected for a first period, and test means that is enabled by said pretest means for transmitting a test pulse on the cable medium, for measuring a reflection amplitude and for calculating a cable length,
wherein said cable testing means determines said cable status based on said measured amplitude and said calculated cable length,
wherein the indicator displays at least one of cable testing status during said test and said cable status after said test, and
wherein said pretest means enables testing if, during said first period, activity is detected and is subsequently not detected for a second period after said activity is detected.

32. A physical layer device that is adapted to communicate with a cable medium and an indicator for providing one of audio and visual information, comprising:
a first input/output terminal;
first transceiver means for communicating with said first input/output terminal over a cable medium; and
cable testing means for testing the cable medium and for determining a cable status using pretest means for sensing activity on the cable medium and enabling testing if activity is not detected for a first period, and test means that is enabled by said pretest means for transmitting a test pulse on the cable medium, for measuring a reflection amplitude and for calculating a cable length,
wherein said cable testing means determines said cable status based on said measured amplitude and said calculated cable length, and
wherein the indicator displays at least one of cable testing status during said test and said cable status after said test;
lookup means for storing a plurality of sets of reflection amplitudes as a function of cable length, wherein said cable testing means determines said cable status using said lookup means, said reflection amplitude and said cable length,
wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

33. The physical layer device of claim 32 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

34. The physical layer device of claim 33 wherein a third window is defined between said second and fourth thresholds.

35. The physical layer device of claim 34 wherein the cable medium is declared an open circuit when said reflection amplitude is in said first window for said cable length and wherein the cable medium is declared a short circuit when said reflection amplitude is in said second window for said cable length, and wherein the cable medium is declared normal when said reflection amplitude is in said third window for said cable length.

36. A physical layer device that is adapted to communicate with a cable medium and an indicator for providing one of audio and visual information, comprising:
a first input/output terminal;
first transceiver means for communicating with said first input/output terminal over a cable medium; and
cable testing means for testing the cable medium and for determining a cable status using pretest means for sensing activity on the cable medium and enabling testing if activity is not detected for a first period, and test means that is enabled by said pretest means for transmitting a test pulse on the cable medium, for measuring a reflection amplitude and for calculating a cable length,
wherein said cable testing means determines said cable status based on said measured amplitude and said calculated cable length, and
wherein the indicator displays at least one of cable testing status during said test and said cable status after said test;
converting means for measuring said reflection amplitude, wherein said test means measures offset at said converting means, subtracts said offset from said reflection amplitude, and zeroes said reflection amplitude below a floor, wherein said floor has a first value during a first period after said test pulse and a second value during a second period after said first period.

37. A method of operating a physical layer device that is adapted to communicate with a cable medium, comprising:
sensing activity on said cable medium;
enabling cable testing if said activity is not detected for a first period;
transmitting a test pulse on said cable medium;
measuring a reflection amplitude;
calculating a cable length; and
determining said cable status based on said measured amplitude and said calculated cable length;
determining a cable status; and
using an indicator to indicate at least one of cable testing status during said test and said cable status after said test; and
using the indicator identify at least one of link presence, link absence, link activity, link duplex and link speed of said first input/output terminal during normal operation.

38. The method of claim 37 further comprising:
using a lookup table that includes a plurality of sets of reflection amplitudes as a function of cable length; and
determining said cable status using said lookup table, said reflection amplitude and said cable length.

39. The method of claim 37 wherein said status includes open circuit and short statuses.

40. The method of claim 37 further comprising:
measuring said reflection amplitude; and
measuring offset.

41. The method of claim 40 further comprising:
subtracting said offset from said reflection amplitude; and
setting said reflection amplitude below a floor equal to zero.

42. The method of claim 41 wherein said floor has a first value during a first period after said test pulse and a second value during a second period after said first period.

43. The method of claim 37 further comprising generating a test fail status when said cable medium is active for a period greater than a test fail period.

44. The method of claim 37 further comprising implementing a cable tester and a physical layer device in a single integrated circuit.

45. The method of claim 37 wherein the indicator includes at least one of an audio indicator and a visual indicator.

46. The method of claim 37 wherein the indicator includes at least one of a speaker, a light emitting diode (LED), and an incandescent light.

47. The method of claim 37 further comprising detecting a power over Ethernet (POE) device before performing said cable medium test.

48. The method of claim 47 further comprising:
selectively providing power over the cable medium when said detector detects said POE device; and
delaying testing of the cable medium when said POE device is detected until power is provided over the cable medium.

49. The method of claim 37 wherein said physical layer device is implemented in an Ethernet network device.

50. The method of claim 49 wherein said Ethernet network device operates at at least one 10 Megabits per second (Mbps), 100 Mbps and 1000 Mbps.

51. A method of operating a physical layer device that is adapted to communicate with a cable medium, comprising:
sensing activity on said cable medium;
enabling cable testing if said activity is not detected for a first period;
transmitting a test pulse on said cable medium;
measuring a reflection amplitude;
calculating a cable length; and
determining said cable status based on said measured amplitude and said calculated cable length;
determining a cable status; and
using an indicator to indicate at least one of cable testing status during said test and said cable status after said test,
wherein said enabling step enables testing if, during said first period, activity is detected and is subsequently not detected for a second period after said activity is detected.

52. A method of operating a physical layer device that is adapted to communicate with a cable medium, comprising:
sensing activity on said cable medium;
enabling cable testing if said activity is not detected for a first period;
transmitting a test pulse on said cable medium;
measuring a reflection amplitude;
calculating a cable length;
determining said cable status based on said measured amplitude and said calculated cable length;
determining a cable status;
using an indicator to indicate at least one of cable testing status during said test and said cable status after said test;
using a lookup table that includes a plurality of sets of reflection amplitudes as a function of cable length; and
determining said cable status using said lookup table, said reflection amplitude and said cable length, and
wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

53. The method of claim 52 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

54. The method of claim 53 wherein a third window is defined between said second and fourth thresholds.

55. The method of claim 54 further comprising:
    declaring said cable medium an open circuit when said reflection amplitude is within said first window for said cable length;
    declaring said cable medium a short circuit when said reflection amplitude is within said second window for said cable length; and
    declaring said cable medium normal when said reflection amplitude is within said third window for said cable length.

56. A method of operating a physical layer device that is adapted to communicate with a cable medium, comprising:
    sensing activity on said cable medium;
    enabling cable testing if said activity is not detected for a first period;
    transmitting a test pulse on said cable medium;
    measuring a reflection amplitude;
    calculating a cable length; and
    determining said cable status based on said measured amplitude and said calculated cable length;
    determining a cable status;
    using an indicator to indicate at least one of cable testing status during said test and said cable status after said test;
    transmitting said test pulse when a common wire is used to transmit and receive;
    measuring offset;
    subtracting said offset from said reflection amplitude; and
    detecting peaks, wherein if a second peak is not detected after a first peak and said reflection amplitude of said first peak is greater than a first threshold, a second test pulse having a second amplitude that is less than a first amplitude of said first test pulse is transmitted and wherein said second amplitude is one-half of said first amplitude.

57. The method of claim 56 further comprising:
    declaring a close open status if said reflection amplitude of a first peak after transmitting said second test pulse is greater than a second threshold; and
    declaring an open status if said first peak is detected after a predetermined period after transmitting said second test pulse.

58. The method of claim 57 further comprising declaring a perfectly terminated status if said first peak is not detected within said predetermined period after transmitting said second test pulse.

59. The method of claim 56 further comprising canceling said test pulse when said cable medium transmits and receives on a common wire.

* * * * *

UNITED STATES PATENT AND TRADEMARK OFFICE
CERTIFICATE OF CORRECTION

PATENT NO. : 7,012,436 B1  Page 1 of 1
APPLICATION NO. : 11/093101
DATED : March 14, 2006
INVENTOR(S) : Donald Pannell et al.

It is certified that error appears in the above-identified patent and that said Letters Patent is hereby corrected as shown below:

Title Page:
Item 57 Line 11          Delete "pilse" and insert --pulse--
Item 57 Line 16          Delete "trst" and insert --test--
Item 57 Line 16          Delete "inducates" and insert --indicates--

Column 2, Line 2         Insert --that-- after "amplitude"
Column 7, Line 44        Delete "refection" and insert --reflection--
Column 7, Line 48        Delete "refection" and insert --reflection--
Column 8, Line 31        Delete "refection" and insert --reflection--
Column 8, Line 34        Delete "refection" and insert --reflection--
Column 10, Line 49       Delete "Is" and insert --If--
Column 17, Line 44       Insert --to-- after "indicator"

Signed and Sealed this

Sixth Day of March, 2007

JON W. DUDAS
*Director of the United States Patent and Trademark Office*